(12) United States Patent
Cui et al.

(10) Patent No.: US 7,573,131 B2
(45) Date of Patent: Aug. 11, 2009

(54) DIE-UP INTEGRATED CIRCUIT PACKAGE WITH GROUNDED STIFFENER

(75) Inventors: Cheng Qiang Cui, Singapore (SG); Kai C. Ng, East Meadow, NY (US); Chee Wah Cheung, Wai Chai (HK)

(73) Assignee: Compass Technology Co., Ltd., Shatin, Hong Kong (HK)

( * ) Notice: Subject to any disclaimer, the term of this patent is extended or adjusted under 35 U.S.C. 154(b) by 285 days.

(21) Appl. No.: 11/588,802

(22) Filed: Oct. 27, 2006

(65) Prior Publication Data
US 2008/0099898 A1    May 1, 2008

(51) Int. Cl.
*H01L 23/34* (2006.01)
*H05K 7/20* (2006.01)
*H01L 21/00* (2006.01)

(52) U.S. Cl. .................. 257/707; 257/713; 257/720; 257/738; 257/780; 257/E23.101; 361/707; 361/710; 438/121; 438/122

(58) Field of Classification Search .................. None
See application file for complete search history.

(56) References Cited

U.S. PATENT DOCUMENTS

| | | | |
|---|---|---|---|
| 5,866,949 A | 2/1999 | Schueller | |
| 5,990,545 A | 11/1999 | Schueller et al. | |
| 6,586,834 B1 | 7/2003 | Sze et al. | |
| 6,753,600 B1 * | 6/2004 | Ho | 257/698 |
| 6,825,108 B2 * | 11/2004 | Khan et al. | 438/613 |
| 6,876,553 B2 * | 4/2005 | Zhao et al. | 361/760 |
| 6,887,741 B2 * | 5/2005 | Zhao et al. | 438/125 |
| 7,005,737 B2 * | 2/2006 | Zhao et al. | 257/707 |
| 7,038,312 B2 * | 5/2006 | Khan et al. | 257/713 |
| 7,078,806 B2 * | 7/2006 | Khan et al. | 257/734 |
| 2005/0173787 A1 | 8/2005 | Zhao et al. | |
| 2006/0065972 A1 | 3/2006 | Khan et al. | |

FOREIGN PATENT DOCUMENTS

| JP | 11102989 A * | 4/1999 |
|---|---|---|
| WO | WO 2004/097896 | 11/2004 |

\* cited by examiner

*Primary Examiner*—Alonzo Chambliss
(74) *Attorney, Agent, or Firm*—Saile Ackerman LLC; Stephen B. Ackerman; Rosemary L. S. Pike

(57) ABSTRACT

A printed circuit substrate is disposed on a bottom side of a stiffener. An IC die is disposed on a top side of the stiffener. The die is electrically connected onto the printed circuit substrate by wire bonding through an open slot in the stiffener. The die is not wire bonded to the stiffener. Solder balls are attached on a bottom side of the substrate and electrically connected to ground bond fingers of the substrate, and also are directly attached to solderable pads on the bottom side of the stiffener through open holes or plated through-holes on the substrate, so as to have the stiffener function as a ground plane and as a heat sink for power dissipation.

26 Claims, 5 Drawing Sheets

DIE-UP INTEGRATED CIRCUIT PACKAGE WITH GROUNDED STIFFENER

BACKGROUND OF THE INVENTION (1) Field of the Invention

The invention relates to processes for packaging integrated circuit dies, and more particularly, to a method of packaging integrated circuit dies with a grounded stiffener.

(2) Description of the Related Art

A cavity-up ball grid array (BGA) package structure, schematically shown in FIG. 1, was originally patented by R. D. Schueller in 1999 in U.S. Pat. Nos. 5,866,949 and 5,990,545. In these patents, a chip scale BGA for integrated circuit (IC) packaging has a non-polymer layer or support structure 10 positioned between a chip 12 and a substrate 14. The non-polymer support layer may be a material, such as copper foil, having sufficient rigidity to allow processing of the chip scale package in strip format. The non-polymer support layer is conductive and could be electrically coupled to the integrated circuit to form a power or ground plane. The non-polymer support layer can be made of copper foil with a thickness of 100 μm-250 μm, but is not limited to copper foil. The adhesive layer may be any adhesive suitable for securing the non-polymer pad 10 to the flexible tape substrate 14. The adhesive layers have a thickness of between about 25 μm and about 75 μm, more typically between about 25 μm and about 50 μm. The stiffener functions as a ground plane and heat spreader by wire bonding and solder ball attachment on the stiffener.

FIG. 2 shows a die-up enhanced BGA with grounded stiffener 10 having wire bonding 21 from an integrated circuit die 12 to the stiffener 10 and thermal balls 20 attached to the stiffener 10 through holes in a substrate 14. This type of package is taught in U.S. Pat. No. 6,586,834 B1, by M. W. Sze et al, International patent application no. WO 2004/097896 A2 by Shelia E. Chopin et al, U.S. patent application Ser. No. 2005/0173787 A1 by S. Z. Zhao et al, and U.S. Pat. No. 7,005,737 B2 by S. Z. Zhao et al.

FIG. 3 shows a heat slug 25 attached to a bottom side of the stiffener 10 to provide the grounded stiffener for thermal enhancement of the die-up BGA packages. This design is disclosed in U.S. Pat. Nos. 6,825,108 B2, 7,078,806 B2, and 7,038,312, all by Reza-ur R. Khan, et al, and U.S. Pat. Nos. 6,876,553 B2 and 6,887,741 B2 by S. Z. Zhao, et al.

SUMMARY OF THE INVENTION

A principal object of the present invention is to provide a cost-effective and very manufacturable method of packaging an IC die.

Another object of the invention is to provide a die-up IC package having optimum thermal performance.

Yet another object of the invention is to provide a die-up IC package having wire bonding from the die to the substrate, but not to the stiffener.

According to the objects of the invention, a method of assembling a die-up IC packaging structure is achieved. A printed circuit substrate is disposed on a bottom side of a stiffener. An IC die is disposed on a top side of the stiffener. The die is electrically connected onto the printed circuit substrate by wire bonding through an open slot in the stiffener. The die is not connected by wire bonding to the stiffener.

Solder balls are attached on a bottom side of the substrate and electrically connected to ground bond fingers of the substrate, and also are directly attached to solderable pads on the bottom side of the stiffener through open holes or plated through-holes on the substrate, so as to have the stiffener function as a ground plane and as a heat sink for power dissipation.

Also according to the objects of the invention, die-up IC packaging structure is achieved. The die-up IC packaging structure of the invention comprises an IC die disposed on a top side of a stiffener and a printed circuit substrate disposed on a bottom side of the stiffener wherein the IC die is electrically connected onto the printed circuit substrate by wire bonding through an open slot in the stiffener and wherein the IC die is not wire bonded to the stiffener.

BRIEF DESCRIPTION OF THE DRAWINGS

In the accompanying drawings forming a material part of this description, there is shown.

DESCRIPTION OF THE PREFERRED EMBODIMENTS

An electrically and thermally enhanced die-up integrated circuit (IC) package structure with grounded stiffener is disclosed. The integrated circuit die sits on the center of the stiffener and all of the wires from the die are bonded onto the bond fingers of the printed circuit substrate including the ground bond fingers. The wires pass through opening slots in the stiffener to reach the substrate. Solder balls are attached on the opposite side of the substrate. The substrate reroutes the bond fingers to the solder balls for $2^{nd}$ level connection with a 1-metal layer, 2-metal layer or multi-layer circuit. The ground bond fingers of the substrate are rerouted to the center of substrate and coupled to the thermal solder balls, so that the stiffener acts as a ground plane and also a heat sink for power dissipation. The thermal solder balls are directly connected onto the solderable pads of the stiffener, through the open hole or plated through-hole (PTH) of the substrate, which connects the ground to the stiffener. The advantage of this disclosure over the prior arts is that wire bondability of the stiffener is not required to achieve the cost effectiveness of the packaging and to simplify the packaging assembly process.

Figure 1:
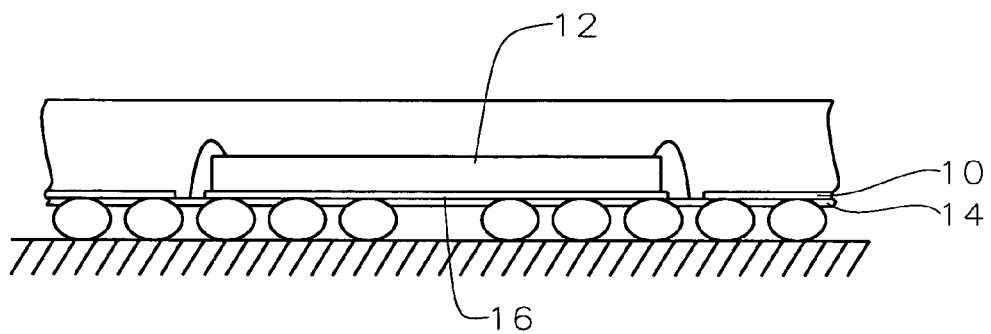
FIGS. 1-3 schematically illustrate in cross-sectional representation die-up packages of the prior art.
Figure 2:
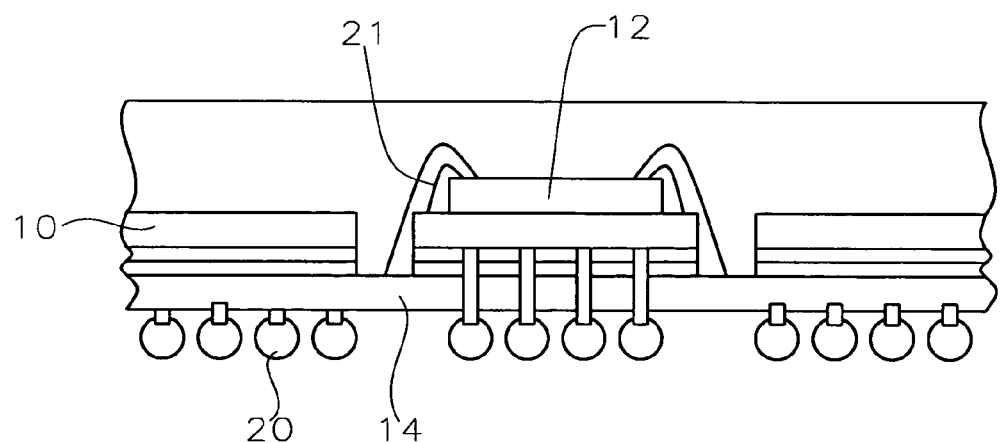
Figure 3:
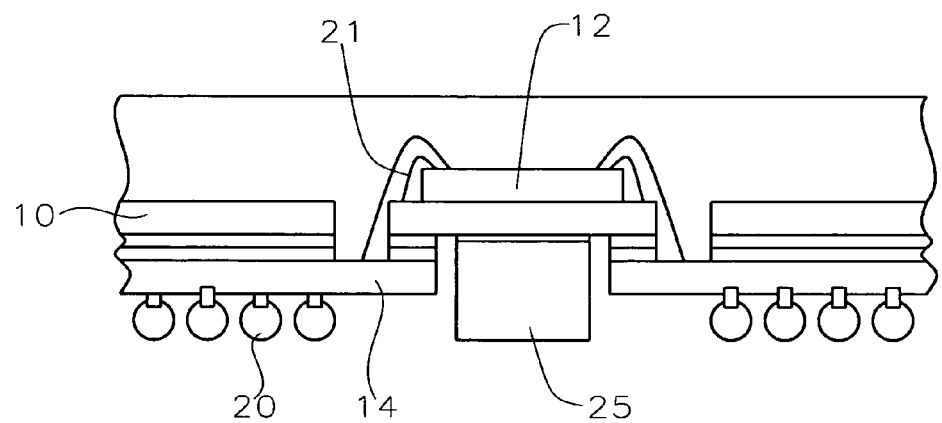
Figure 4:
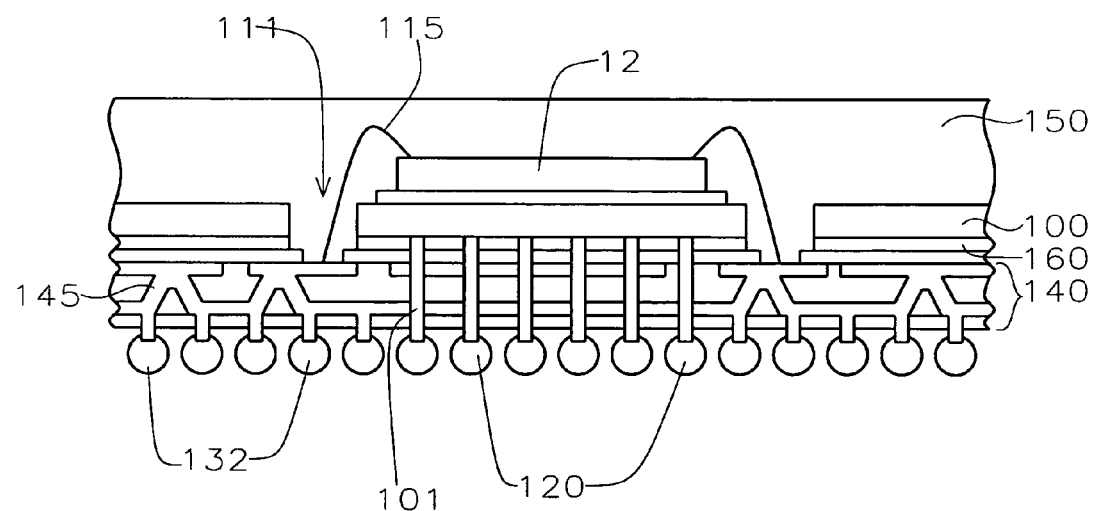
FIG. 4 schematically illustrates in cross-sectional representation a preferred embodiment of the present invention.
Figure 5A:
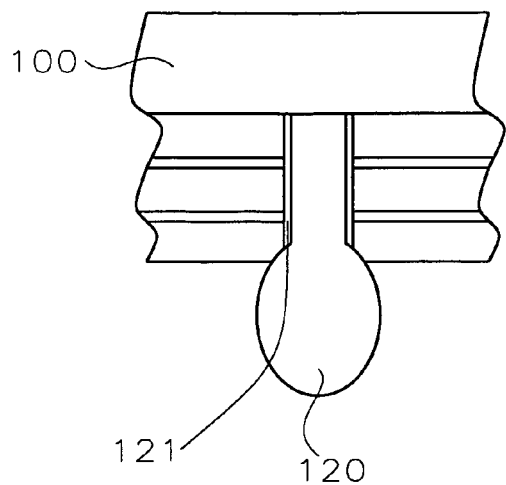
FIGS. 5A and 5B schematically illustrate in cross-sectional representation enlarged views of two alternative structures in FIG. 4.
Figure 5B:
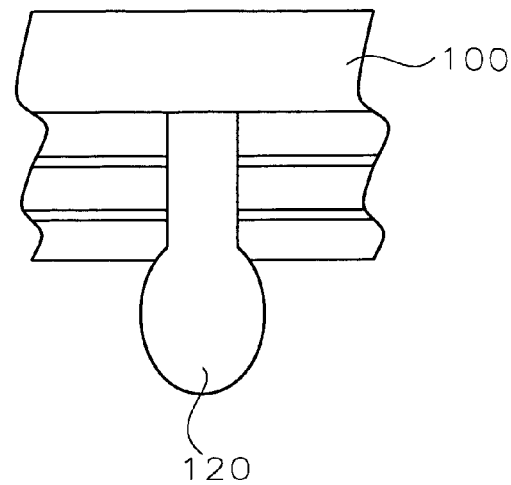
Figure 7A:
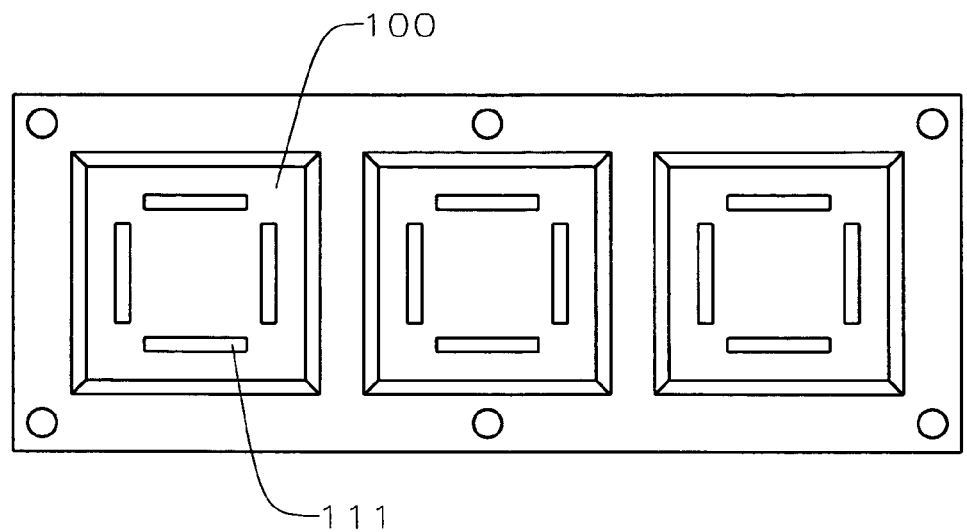
FIGS. 7A and 7B schematically illustrate a top view and a bottom view, respectively, of one preferred embodiment of the present invention.
Figure 7B:
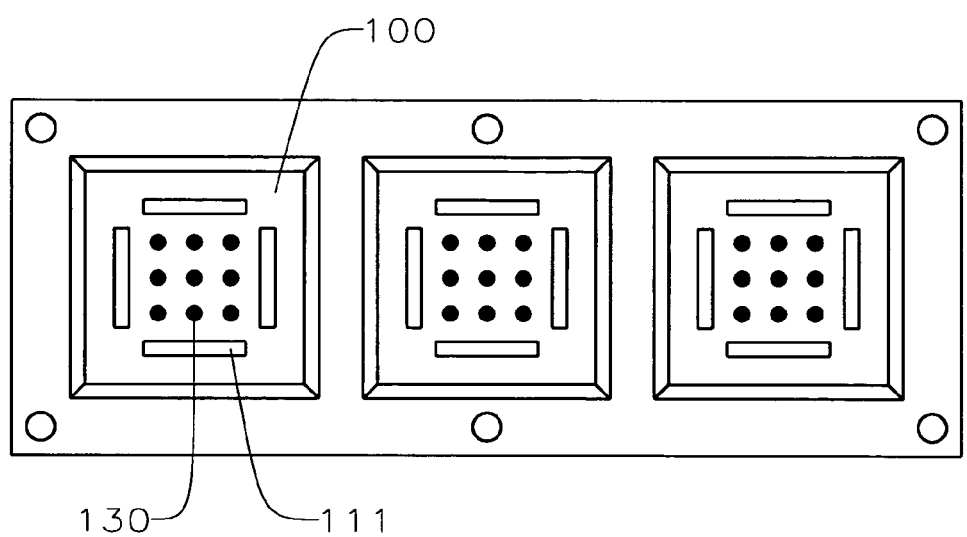
Figure 8A:
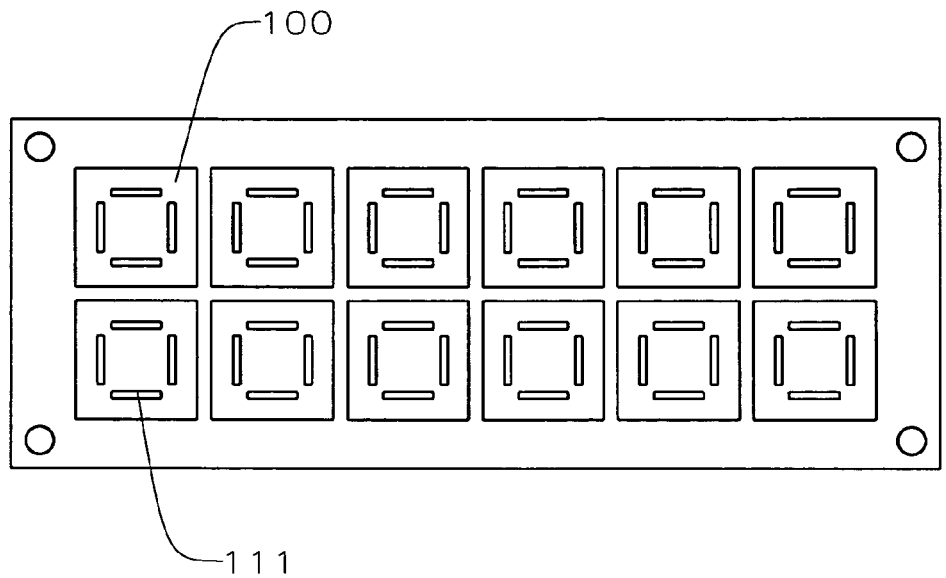
FIGS. 8A and 8B schematically illustrate a top view and a bottom view, respectively, of a second preferred embodiment of the present invention.
Figure 8B:
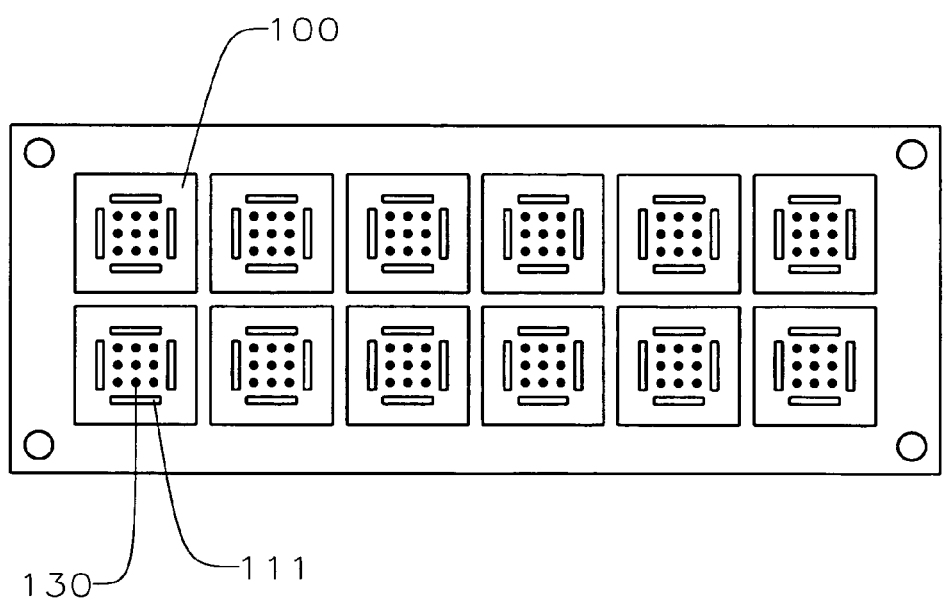

FIG. 4 shows a die-up package of the present invention. Substrate 140 could be a 1-metal layer, 2-metal layer or multiple metal layer circuit, made of flexible tape polyimide-based substrate, semi-rigid epoxy-based substrate or laminated rigid substrate. Metal conductors 145 are shown within the substrate connecting top and bottom metal traces. The open holes or plated through-holes 101 at the center of the substrate are made by mechanical punching or drilling to have thermal solder balls 120 electrically connected to the solderable pads 130 of the stiffener 100. Solderable pads 130 are shown in FIGS. 7B and 8B. FIGS. 5A and 5B show a plated through hole and an open hole, respectively.

In FIG. 5A, the thermal solder ball 120 is connected to the stiffener through the sidewall of the plated through hole and the clearance of the hole. In FIG. 5B, the thermal solder ball 120 is connected to the stiffener only through the clearance of the hole which is not a plated through hole. That is, the plated through-hole has copper conductor 121 on the sidewall of the hole. The open hole has no copper conductor on the sidewall of the hole.

Solder balls 132 are formed on the bottom surface of the substrate. Some of these balls are thermal balls 120, directly attached to the stiffener through the open holes or plated through holes of the substrate 140 to couple the stiffener as a ground plane. Other solder balls 132 are connected only to the substrate for connection to a second level printed circuit board, not shown. The arrangement of solder balls 132 and thermal solder balls 120 is not limited to that shown in FIG. 4, but can be of any workable design.

The substrate 140 is laminated onto the bottom surface of the stiffener 100 having solderable pads using an adhesive film 160 that could be thermo-set epoxy material having a thickness of 0.025-0.1 mm. The stiffener 100 is made of copper or aluminum or composite material at a thickness of 0.125-1.0 mm with good thermal conductivity and rigidity.

The stiffener could have different strip formats for IC packaging assembly processes based on the package body size. Some examples of stiffener strip format are shown in FIGS. 7A-B for ball grid array (BGA) packages and in FIGS. 8A-B for chip scale packages (CSP). For example, FIG. 7A shows a top view of the stiffener 100 with slots 111 ready for die attachment. Three dies will be attached, one in each section shown in this example. FIG. 8A shows a stiffener strip with space for 12 dies to be attached, for example. FIGS. 7B and 8B illustrate the bottom side view of the stiffener strips, showing the solderable pads 130 for thermal solder ball attachment.

The stiffener can be fabricated using chemical etching or mechanical stamping. The stiffener could be bare Cu or Al metal or composite material, treated with an organic solder preventative (OSP), brown oxide, black oxide or Ni finish. Both top and bottom surfaces of the stiffener are treated to prevent oxidation and discoloration after the stiffener is subjected to thermal exposure and to enhance the adhesion of the stiffener to adhesives.

The solderable pads on the bottom surface of the stiffener can be treated by OSP, Sn, eutectic or lead-free solders, or Ni/Au finish for good solderability when the thermal balls are electrically connected onto the stiffener.

The die 12 is attached to the top side of the stiffener by conventional die attach adhesive or bonding films. The die is wire bonded 115 onto the bond fingers of the printed circuit substrate 140. The wires pass through opening slots 111 in the stiffener 100 to reach the substrate 140.

Figure 6A:
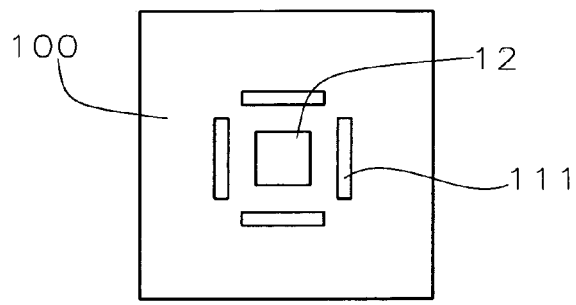
FIG. 6A schematically illustrates a top view of FIG. 4.
Figure 6B:
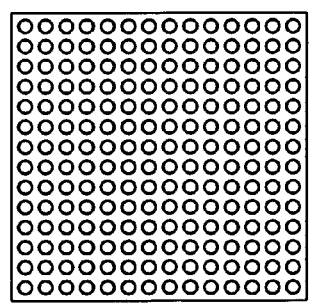
FIGS. 6B and 6C schematically illustrate bottom views of FIG. 4.
Figure 6C:
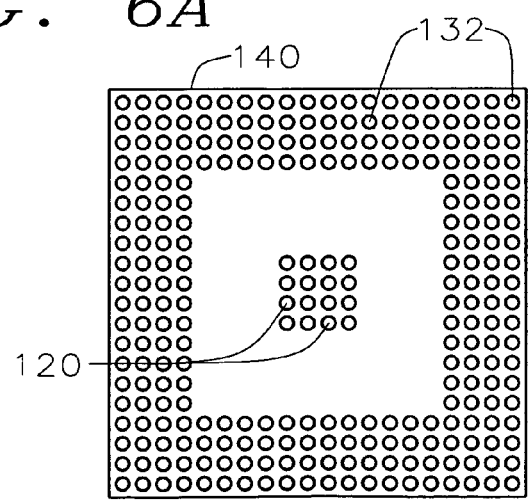

FIG. 6A shows a top view of FIG. 4, illustrating the die 12 attached to the stiffener 100. FIG. 6B shows a bottom view of FIG. 4 at full array showing solder balls 132 and thermal solder balls 120. FIG. 6C shows a bottom view of FIG. 4 showing solder balls 132 and thermal solder balls 120 on the bottom surface of the substrate 140 at depopular array.

The IC package is encapsulated with transfer molding, glue top dispensing or printing 150. The singulation of the package can be done with punching to cut the tier bar for BGA packages, or dicing for CSP matrix packages.

An advantage of the present invention over prior arts is that wire bonding is not required on the stiffener. Therefore, metal finish on the stiffener for wire bonding is not required and separate wire bonding onto the stiffener and the substrate in the packaging assembly is also not required to achieve the cost effectiveness of the packaging, While the invention has been particularly shown and described with reference to the preferred embodiments thereof, it will be understood by those skilled in the art that various changes in form and details may be made without departing from the spirit and scope of the invention.

What is claimed is:

1. A die-up IC packaging structure comprising:
an IC die disposed on a top side of a stiffener;
a printed circuit substrate having its top side attached on a bottom side of said stiffener wherein said IC die is electrically connected onto said printed circuit substrate by wire bonding through an open slot in said stiffener wherein there are no wire bonds from said IC die to said stiffener and solder balls attached on a bottom side of said substrate wherein at least some of said solder balls are electrically connected to ground bond fingers of said substrate, and also are directly attached to solderable pads on said bottom side of said stiffener through open holes or plated through-holes on said substrate, so as to have said stiffener function as a ground plane and as a heat sink for power dissipation.

2. The structure according to claim 1 wherein ground pads of said IC die are wire bonded to said printed circuit substrate.

3. The structure according to claim 1 wherein said substrate comprises a 1-metal layer, 2-metal layer or multi-metal layer printed circuit, comprising flexible polyimide-based substrates, semi-rigid epoxy-based substrates, or laminated epoxy composite rigid substrates.

4. The structure according to claim 1 wherein said stiffener comprises copper, aluminum, or composite materials having a thickness of 0.125-1.0 mm.

5. The structure according to claim 1 wherein said top side and said bottom side of said stiffener are treated with organic solder preventative (OSP), brown oxide, black oxide or Ni finish.

6. The structure according to claim 1 wherein solderable ball pads on said bottom side of said stiffener are finished with OSP, Sn, eutectic or lead-free solder, or Ni/Au.

7. The structure according to claim 1 wherein said substrate is laminated onto said bottom side of said stiffener using adhesive film comprising thermo-set epoxy type adhesive having a thickness of 0.025-0.1 mm.

8. The structure according to claim 1 further comprising encapsulation of said IC die by transfer molding, glue top dispensing or printing with epoxy composite material.

9. The method according to claim 1 further comprising fabricating said stiffener of copper or composite materials having a thickness of 0.125-1.0 mm and forming said open slot by chemical etch or mechanical stamping.

10. The method according to claim 1 further comprising treating said top side and said bottom said of said stiffener with organic solder preventative (OSP), brown oxide, black oxide or Ni finish.

11. A method of assembling a die-up IC packaging structure comprising:
providing a printed circuit substrate having its top side attached on a bottom side of a stiffener;
disposing an IC die on a top side of said stiffener; and
electrically connecting said IC die onto said printed circuit substrate by wire bonding through an open slot in said stiffener wherein there is no wire bonding from said IC die to said stiffener attaching solder balls on a bottom side of said printed circuit substrate; electrically connecting at least some of said solder balls to ground bond fingers of said substrate; and directly attaching these said solder balls to solderable pads on said bottom side of said stiffener through open holes or plated through-holes on said substrate, whereby said stiffener functions as a ground plane and as a heat sink for power dissipation.

12. The method according to claim 11 further comprising wire bonding ground pads of said IC die to said printed circuit substrate.

13. The structure according to claim 11 wherein said substrate comprises a 1-metal layer, 2-metal layer or multi-metal layer printed circuit, comprising flexible polyimide-based substrates, semi-rigid epoxy-based substrates, or laminated epoxy composite rigid substrates.

14. The method according to claim 11 further comprising forming said open holes or plated through-holes of the said substrate by mechanical punching or drilling.

15. The method according to claim 11 further comprising finishing said solderable pads on said bottom side of said stiffener with OSP, Sn, eutectic or lead-free solder, or Ni/Au.

16. The method according to claim 11 further comprising laminating said printed circuit substrate onto said bottom side of said stiffener using adhesive film comprising thermo-set epoxy type adhesive having a thickness of 0.025-0.1 mm.

17. The method according to claim 11 further comprising encapsulating said IC die by transfer molding, glue top dispensing or printing with epoxy composite material.

18. The method according to claim 11 wherein said stiffener is fabricated in strip or matrix format.

19. A die-up IC packaging structure comprising:
an IC die disposed on a top side of a stiffener;
a printed circuit substrate disposed on a bottom side of said stiffener wherein said IC die is electrically connected onto said printed circuit substrate by wire bonding through an open slot in said stiffener and wherein said IC die is not wire bonded to said stiffener; and
solder balls attached on a bottom side of said substrate wherein at least some of said solder balls are electrically connected to ground bond fingers of said substrate, and also are directly attached to solderable pads on said bottom side of said stiffener through open holes or plated through-holes on said substrate, so as to have said stiffener function as a ground plane and as a heat sink for power dissipation.

20. The structure according to claim 19 wherein ground pads of said IC die are wire bonded to said printed circuit substrate.

21. The structure according to claim 19 wherein said substrate comprises a 1-metal layer, 2-metal layer or multi-metal layer printed circuit, comprising flexible polyimide-based substrates, semi-rigid epoxy-based substrates, or laminated epoxy composite rigid substrates.

22. The structure according to claim 19 wherein said stiffener comprises copper or composite materials having a thickness of 0.125-1.0 mm.

23. The structure according to claim 19 wherein said top side and said bottom said of the said stiffener are treated with organic solder preventative (OSP), brown oxide, black oxide or Ni finish.

24. The structure according to claim 19 wherein solderable ball pads on said bottom side of said stiffener are finished with OSP, Sn, eutectic or lead-free solder, or Ni/Au.

25. The structure according to claim 19 wherein said substrate is laminated onto said bottom side of said stiffener using adhesive film comprising thermo-set epoxy type adhesive having a thickness of 0.025-0.1 mm.

26. The structure according to claim 19 further comprising encapsulation of said IC die by transfer molding, glue top dispensing or printing with epoxy composite material.

* * * * *